United States Patent
Liu et al.

(10) Patent No.: US 7,193,447 B1
(45) Date of Patent: Mar. 20, 2007

(54) DIFFERENTIAL SENSE AMPLIFIER LATCH FOR HIGH COMMON MODE INPUT

(75) Inventors: Shao H. Liu, Cupertino, CA (US); Tri K. Tran, San Leandro, CA (US); Brian W. Amick, Brookline, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/839,941

(22) Filed: May 6, 2004

(51) Int. Cl.
*G01R 19/00* (2006.01)
*G11C 7/00* (2006.01)
*H03F 3/45* (2006.01)
(52) U.S. Cl. .............................. 327/57; 327/55; 327/56
(58) Field of Classification Search ............ 327/50–57; 365/205, 207
See application file for complete search history.

(56) References Cited

U.S. PATENT DOCUMENTS

| | | | | |
|---|---|---|---|---|
| 4,845,675 A | * | 7/1989 | Krenik et al. ............... | 365/203 |
| 5,594,696 A | * | 1/1997 | Komarek et al. ........... | 365/208 |
| 5,942,918 A | * | 8/1999 | Ang et al. .................... | 327/57 |
| 5,977,798 A | * | 11/1999 | Zerbe ........................... | 326/98 |
| 6,411,131 B1 | * | 6/2002 | Ang et al. .................... | 327/52 |
| 6,888,380 B2 | * | 5/2005 | Aoki ............................ | 327/57 |
| 2003/0201800 A1 | * | 10/2003 | Matsuo et al. ................ | 327/57 |

* cited by examiner

*Primary Examiner*—Tuan T. Lam
(74) *Attorney, Agent, or Firm*—Dorsey & Whitney LLP

(57) ABSTRACT

A sense amplifier latch that is operable to interface with high common-mode input voltages with wide ranges for all process variations. The sense amplifier latch comprises a cross-coupled latch having first and second rail signals; a pre-charge device; an equalization device; pass devices for enabling input devices to receive pad and reference inputs. In the present invention, the input devices comprise push-pull impedance dividers are used to preserve the input difference voltage while dramatically lowering the common-mode output voltage. The outputs of the impedance dividers are fed to the cross-coupled latch of the sense amplifier using n-channel pass gates.

8 Claims, 5 Drawing Sheets

DIFFERENTIAL SENSE AMPLIFIER LATCH FOR HIGH COMMON MODE INPUT

FIELD OF THE INVENTION

The present invention generally relates to integrated circuits, and more particularly, to a differential sense amplifier with impedance dividers to reduce the effects of input signals having high common-mode voltages.

BACKGROUND OF THE INVENTION

Differential sense amplifier latches are frequently used in input/output (IO) circuits to latch external input signals with short setup and hold times. The external signals, however, frequently have high common-mode voltages that are not compatible with the power supply voltage levels of the sense amplifier latch for a state-of-the-art 90 nm process. For example, the external signals may have common-mode voltages of 1.125 v for logic voltages 1.5 v and 0.75 v, while the power supply voltage levels of the sense amplifier latch may be 1.1 v and 0 v. As a result, these latches frequently require voltage translator circuits, such as source followers, inserted between them and the external signals to translate external voltages to levels appropriate for the conventional latches. The common-mode input voltage, however, could have such a wide range (e.g., 0.775 v to 1.475 v) that the translator and, therefore, the conventional sense amplifier latch circuits, may not work in all integrated circuit process corners.

If a conventional differential sense amplifier latch is used to directly interface with wide-range common-mode inputs, the input pull-down devices are difficult to implement. As a result, they cannot accept input signals with a small difference and large common-mode voltages, since they are not effective in creating rail voltage differences under such conditions. The result is that the rail voltages of the sense amplifier are driven very low (toward ground) with very little difference between the rails, thus failing to provide reliable operation. As a result, conventional sense amplifier latches require voltage translator circuits to translate input voltages to appropriate levels when input signals with small differences and large common-mode voltages are encountered.

In view of the foregoing, there is a need for an improved sense amplifier latch that is capable of directly interfacing with high common-mode input voltages while working in all integrated circuit process corners.

SUMMARY OF INVENTION

The method and apparatus of the present invention provides a sense amplifier latch that is operable to interface with high common-mode input voltages while preserving desirable performance characteristics. In an embodiment of the present invention, a sense amplifier latch comprises a cross-coupled latch having first and second sense rails; a pre-charge device; an equalization device; pull-down devices and input devices for receiving pad and reference inputs and pass devices for controlling said input devices. The present invention employs push-pull impedance dividers to preserve the input differential voltage, while dramatically lowering the common-mode voltage of input signals. In an embodiment of the invention, the common-mode voltage can be lowered to approximately 0.3 V and the impedance dividers can be powered using a conventional 1.1 V logic power supply.

Using the push-pull impedance dividers to lower the common-mode voltages in the sense amplifier latch of the present invention, it is possible to interface directly with high common-mode input voltages while operating in all integrated circuit process corners.

Other aspects and advantages of the invention will be apparent from the following description and the appended claims.

DETAILED DESCRIPTION

Figure 1:
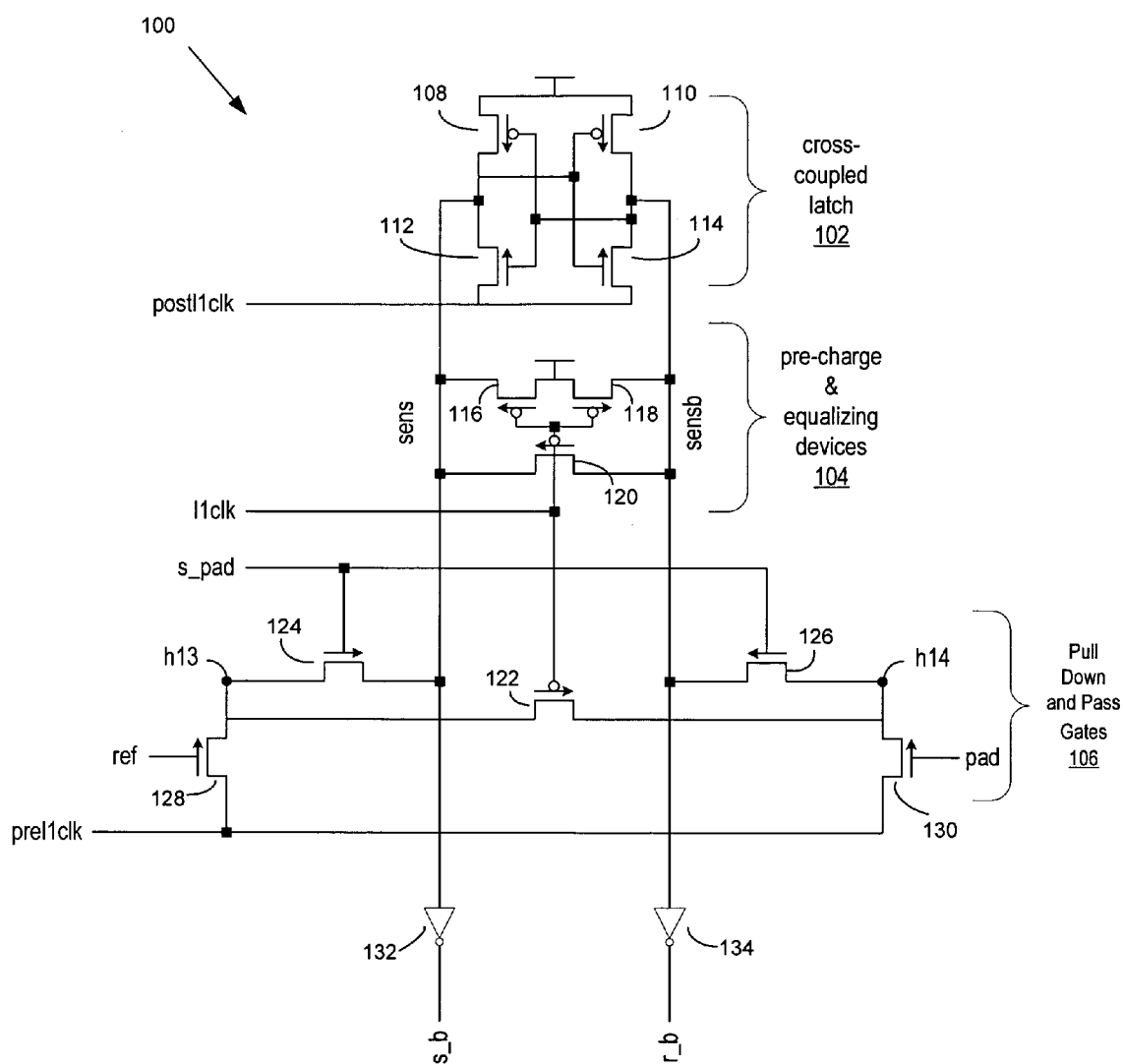
FIG. 1 is a schematic representation of a conventional sense amplifier latch.

FIG. 1 is a schematic representation of a conventional sense amplifier latch 100. The sense amplifier latch 100 is broadly comprised of a cross-coupled latch 102, that generates rail signals "sens" and "sensb," precharging and equalization devices 104, and the pull-down and pass gate devices 106 for inputs "pad" and "ref." The cross-coupled latch 102 comprises first and second p-channel transistors 108 and 110 connected in a cross-coupled arrangement with first and second n-channel transistors 112 and 114. The sources of the n-channel transistors 112 and 114 are connected to receive a "postllclk" signal discussed in greater detail below. The outputs of the cross-coupled latch 102 are carried on the "sens" and "sensb" rails. The pre-charge and equalizing devices module 104 comprises four p-channel transistors 116, 118, 120, and 122 that have their gates connected to receive an "llclk" input discussed in further detail below in connection with the timing diagram of FIG. 2. The pull-down and pass gates module 106 comprises n-channel transistor pass gates 124 and 126 and pull-down n-channel transistors 128 and 130. The gates of the pass gates 124 and 126 are tied to the "s_pad" input and the gates of the input transistors 128 and 130 are tied to the "ref" and "pad" inputs, respectively. Each of these inputs will be discussed in detail below in connection with the timing diagram of FIG. 2. The outputs "s_b" and "r_b" of the sense amplifier 100 are passed through inverters 132 and 134, respectively.

Figure 2:
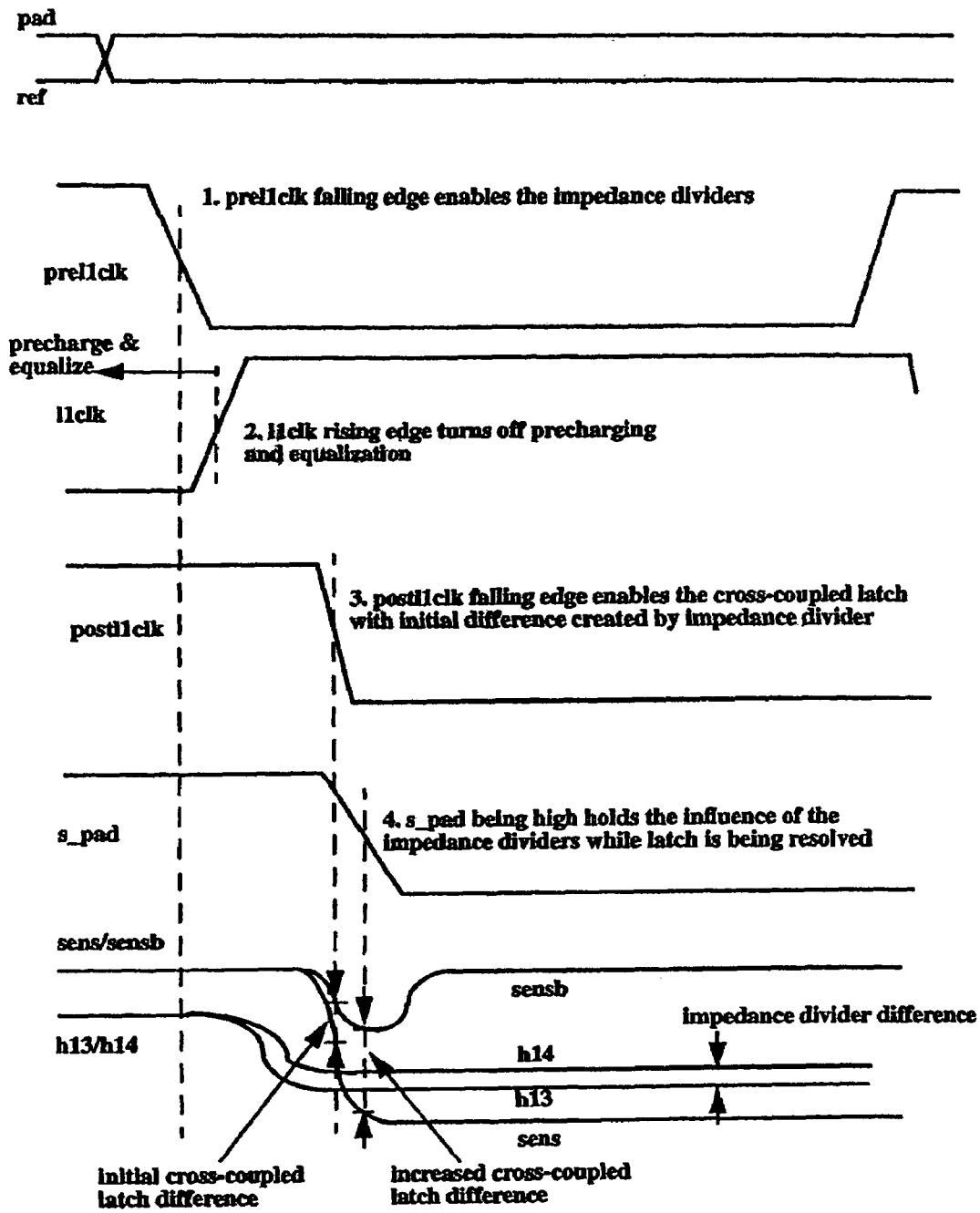
FIG. 2 is a graphical illustration of the clock timing sequences for the differential sense amplifier.

FIG. 2 is a graphical illustration of the timing sequence of clock signals and control signals for the differential sense amplifier 100. The timing sequence illustrated in FIG. 2 as discussed hereinbelow is used to describe the operation for both the conventional sense amplifier 100 illustrated in FIG. 1 and also for the improved sense amplifier latch of the present invention illustrated in FIG. 3. Referring to FIG. 2, clock signals and control signals are supplied to latch a small differential input with the following sequence:

Prior to the llclk rising edge, rails "sens" and "sensb" are precharged and equalized to supply voltage Vdd (1.1 v). The "s_pad" is then turned on for the pass gates 124 and 126. Intermediate nodes hl3 and hl4 are precharged and equalized to voltages one threshold below Vdd. The falling edge of the clock "prellclk" starts the pull-down action through the input devices 128 and 130. The rising edge of the clock "llclk" turns off precharging and equalization. Next, nodes hl3 and hl4 start to go low but diverge due to a difference in pull-down strength of the input devices 128 and 130 which in turn is due to the input difference voltage. Signals "sens" and "sensb" start to go low, but diverge due to the difference in nodes hl3 and hl4. The falling edge of clock "postllclk" then activates the cross-coupled transistors in the latch module 102. The initial difference at "sens" and "sensb" is amplified into full digital signals due to the positive feedback nature of the cross-coupled latch. Buffered inverter outputs "s_b" and "r_b" for "sens" and "sensb" are then used to drive another slave latch as negative active set and reset signals.

The input devices 128 and 130 have gate signals "ref" and "pad" as inputs. The input devices 128 and 130 operate as pull-down devices to latch rails "sens" and "sensb" when pass gate devices 124 and 126 are turned on. As such, they cannot accept input signals with small difference and large common-mode voltages, since they are not effective in creating a "sens/sensb" rail difference under such conditions. The end result is that sens/sensb are driven very low (toward ground) with very little difference for reliable operation. As a result, the conventional sense amplifier latch requires voltage translator circuits to translate input voltages to appropriate levels when input signals with small difference and large common-mode voltages are encountered.

Figure 3:
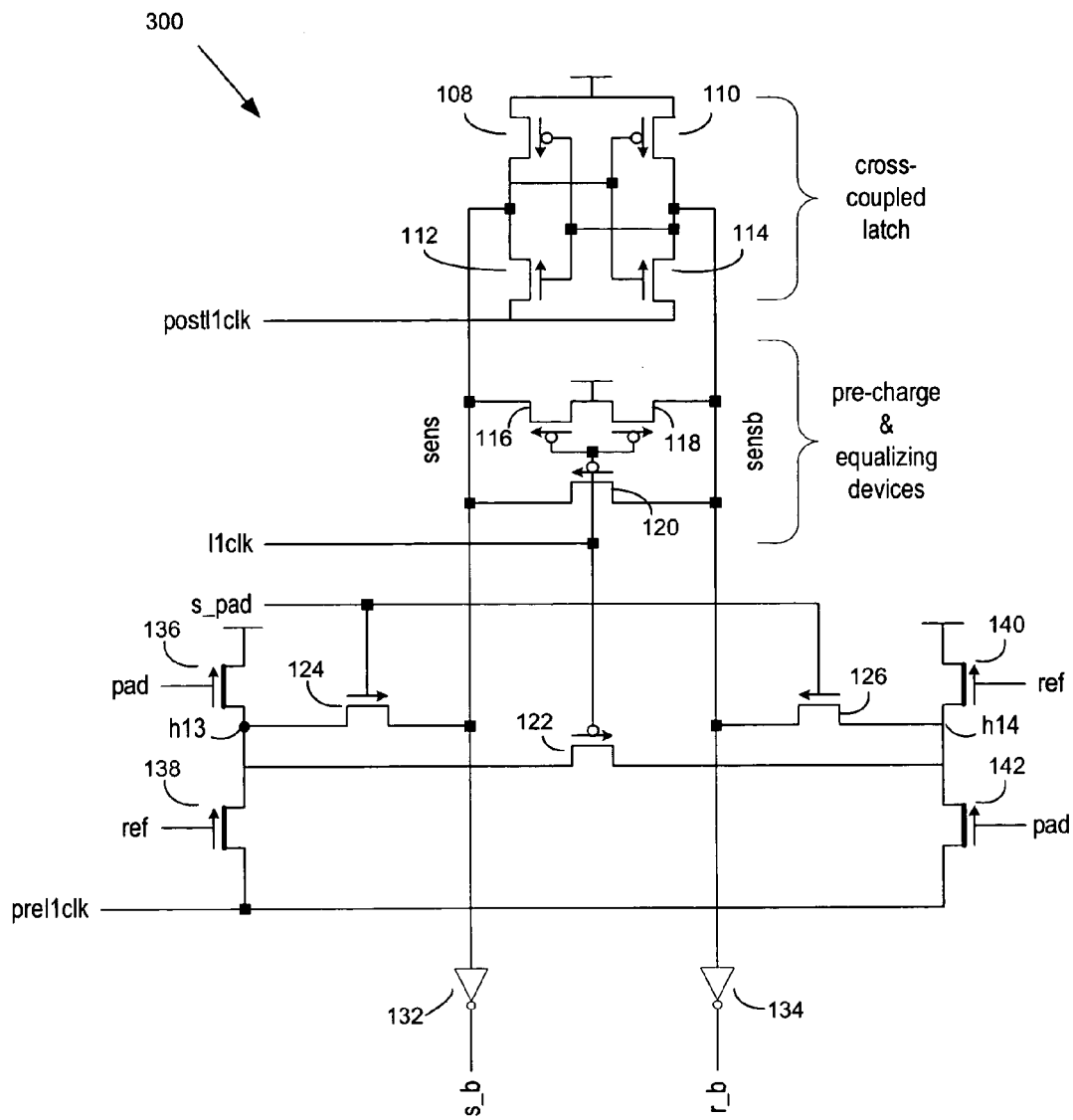
FIG. 3 is a schematic representation of an embodiment of the sense amplifier latch with adaptive pull-down in accordance with an embodiment of the present invention.

FIG. 3 is an illustration of an embodiment of the improved sense amplifier latch 300 of the present invention that can directly interface with high common-mode input voltages. In the sense amplifier 300, the source follower inputs shown in FIG. 1 are replaced by push-pull impedance dividers 136, 138, 140 and 142 that are operable to preserve the input difference voltage while dramatically lowering the common-mode output voltage to about 0.3 v. The impedance dividers 136, 138, 140, and 142 can be powered by a conventional 1.1 v logic supply voltage. The outputs of the impedance dividers are fed to the cross-coupled latch part of the sense amplifier latch 300 via n-channel pass-gates 124 and 126. With common-mode voltage of about 0.3 v at the source, and full-on (logic 1) 1.1 v at the gate of the pass gate, the push-pull divider differential outputs then reliably create a difference voltage at the sense/sensb rails of the cross-coupled latch.

High common-mode input voltage can sometimes exceed the logic supply voltage. Therefore in one embodiment of the present invention, thick-oxide gate transistors are used for the impedance dividers 136, 138, 140 and 142 to ensure gate oxide integrity.

Figure 4:
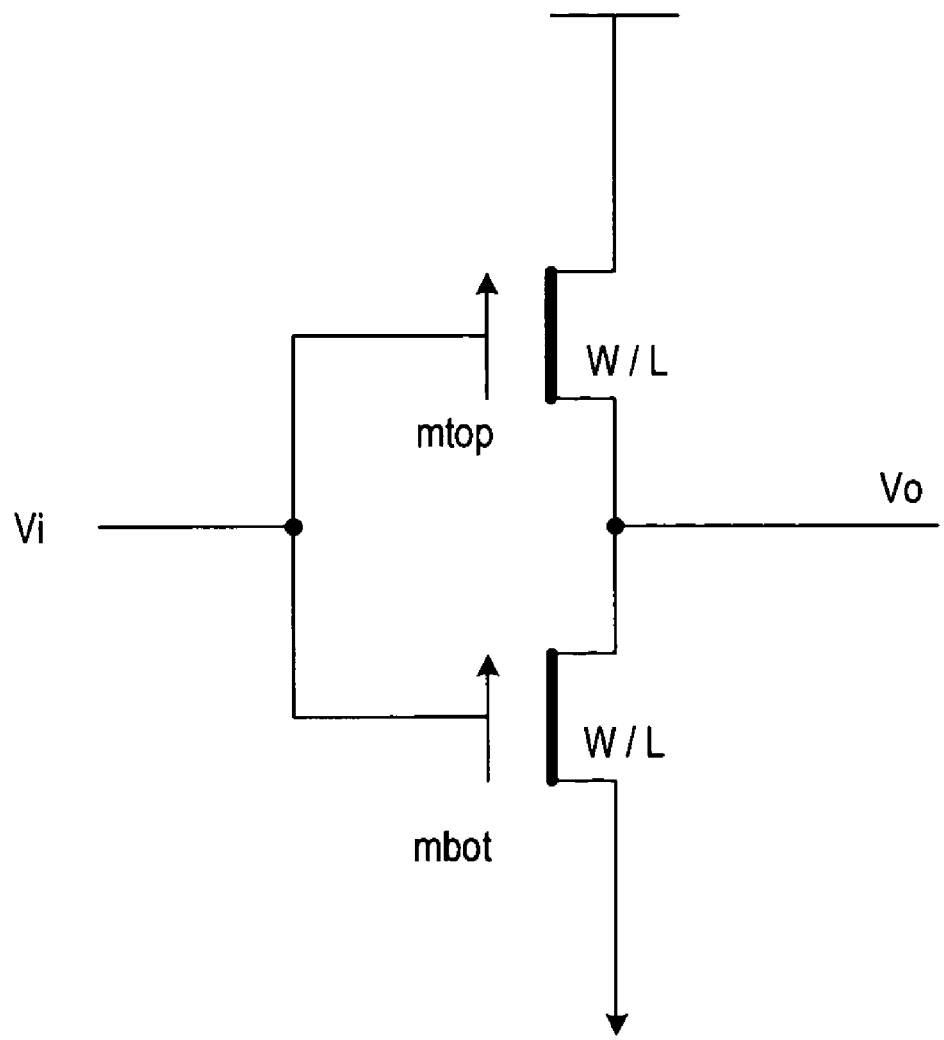
FIG. 4 is a schematic illustration of circuit components used in the push-pull impedance divider implemented in the sense amplifier latch of the present invention.

Operation of the impedance divider common-mode input and output can be understood by referring to the schematic illustration of FIG. 4 and the following MOS current equations, assuming the transistor sizes are identical and the power supply value is $V_{dd}$:

$I_{ds}=K_n(W/L)[(V_{gs}-V_t)V_{ds}-V_{ds}^2/2]$ if the device is in linear region ($V_{gd}>V_t$), $I_{ds}=K_n(W/L)[(V_{gs}-V_t)^2/2]$ if the device is in saturation region ($V_{gd}<=V_t$), Where $K_n$ is the transistor parameter related to electron mobility and oxide capacitance per unit area, W/L the transistor width and length, $V_{gs}$ the gate-to-source voltage, $V_{gd}$ the gate-to-drain voltage, and $V_t$ the device threshold voltage.

It can be shown that the impedance divider common-mode output $V_o$ is a function of the common-mode input $V_i$ assuming that the bottom device mbot is in linear region.

$V_o=(V_i-V_t)-sqrt[(V_i-V_t)2-(V_i-V_t-V_{dd}/2)V_{dd}]$ if the top device mt is in linear region ($V_i-V_{dd}>V_t$).

$V_o=0.253(V_i-V_t)$ if top device mt is in saturation region ($V_i-V_{dd}<=V_t$)

Assume $V_t$=0.25 v to 0.35 v. These equations show that for common-mode input V range of 0.775 v to 1.475 v and $V_{dd}$ range of 0.9 v to 1.3 v, the common-mode input $V_O$ range is 0.124 v to 0.359 v.

Figure 5:
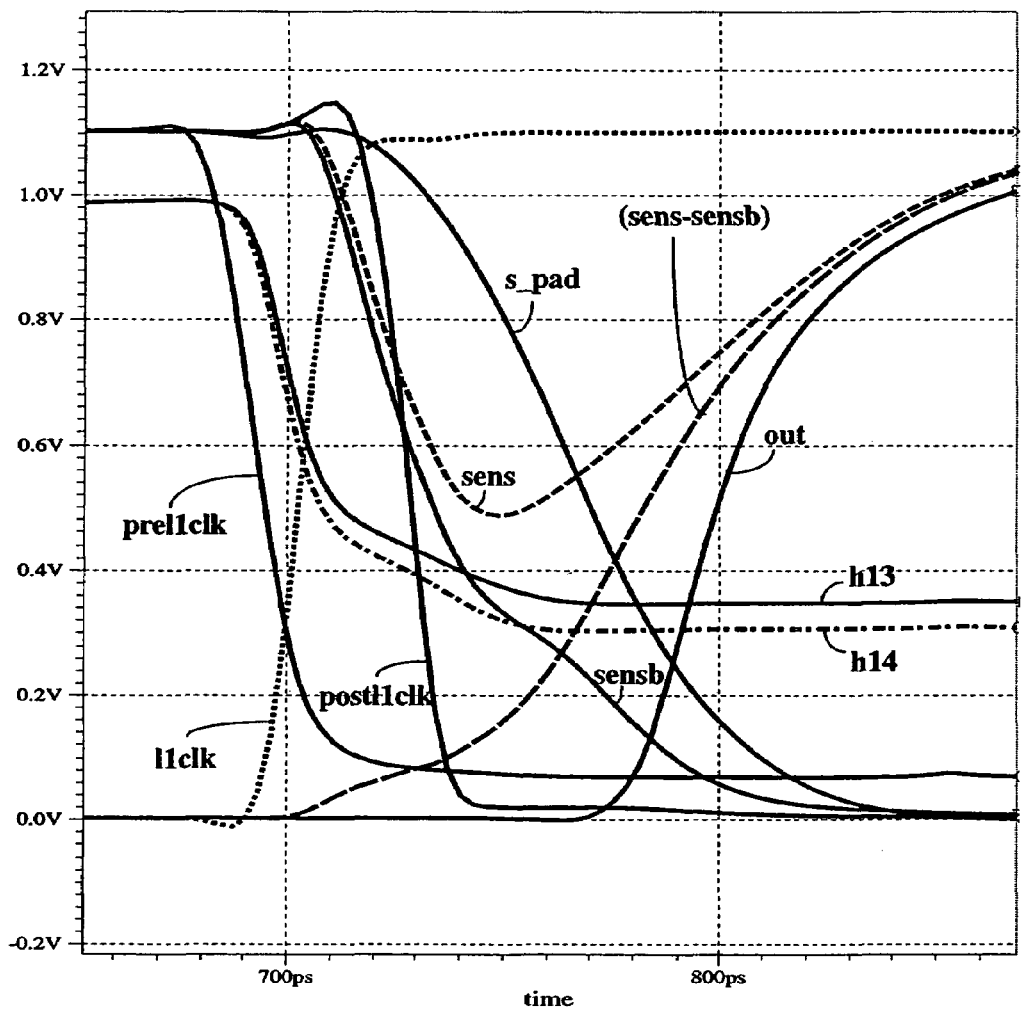
FIG. 5 is a graphical illustration of the signal responses of a sense amplifier of the present invention showing improved sens/sensb responses.

FIG. 5 is a graphical illustration of a simulation of the improved sense amplifier circuit 300 implemented with a state of the art 90 nm process, with =+/−70 mv differential input and 0.775 v to 1.475 v common-mode voltage and $V_{dd}$ supply range of 0.9 v to 1.3 v. As will be understood by those of skill in the art, the sense amplifier latch 300 of the present invention can work reliably for all process corners with at least 30 mv of sense/sensb difference when measured at the falling edge of postllclk.

Other embodiments are within the following claims. Although the present invention has been described in detail, it should be understood that various changes, substitutions and alterations can be made hereto without departing from the spirit and scope of the invention as defined by the appended claims.

What is claimed is:

1. A sense amplifier latch, comprising:
   a latch module operable to generate first and second rail signals;
   a precharge and equalization module;
   an impedance divider network comprising a plurality of MOS devices connected in a push-pull configuration, said impedance divider network having a plurality of input ports operable to receive first and second input signals;
   first and second pass gates operable to control operation of said impedance divider network to receive one of said first and second input signals;
   the impedance divider network comprising first and second MOS devices in a first push pull configuration, the first push pull configuration operable to receive the other of the first and second input signals and a reference signal, and third and fourth MOS devices in a second push pull configuration, the second push pull configuration operable to receive the other of the first and second input signals and said reference signal;
   a first output of the first push pull configuration coupled with the first pass gate, the first pass gate coupled with the first rail signal;
   a second output of the second push pull configuration coupled with the second pass gate, the second pass gate coupled with the second rail signal;
   wherein said first and second rail signals are initially precharged to Vdd and thereafter are pulled down to a predetermined voltage level in response to said first and second input signals; and
   wherein, said MOS devices in said impedance divider network have substantially identical feature sizes and are operable to maintain a difference between said first and second input signals, while maintaining a common mode output voltage at a predetermined level.

2. The sense amplifier according to claim 1, wherein said plurality of MOS devices comprise thick-oxide MOS transistors.

3. The sense amplifier according to claim 2, wherein said impedance divider network comprises four n-channel MOS devices, wherein two of said MOS devices receive the other the said first and second input signals and two of said MOS devices receive said reference signal.

4. The sense amplifier according to claim 3, wherein the outputs of said MOS devices are communicated to said latch module by said first and second pass gates.

5. A method of generating output signals from a sense amplifier latch, comprising:

receiving a first and a second input signal in an impedance divider network comprising a plurality of MOS devices connected in a push-pull configuration, said impedance divider network having a plurality of input ports operable to receive one of said first and second input signals and a reference signal, the impedance divider network comprising first and second MOS devices in a first push pull configuration, the first push pull configuration operable to receive the one of first and second input signals and said reference signal, and third and fourth MOS devices in a second push pull configuration, the second push pull configuration operable to receive one of the first and second input signals and said reference signal;

using a first and a second pass gate to control operation of said impedance divider network to receive the other of said first and second input signals and to generate output signals therefrom the first pass gate communicating with a first rail output signal, the second pass gate communicating with a second rail output signal; and using a latch module to process said output signals from said impedance divider to generate the first and second rail output signals corresponding to a difference in said first and second input signals;

wherein said first and second rail signals are initially precharged to Vdd and thereafter are pulled down to a predetermined level in response to said first and second input signals; and wherein, said MOS devices in said impedance divider network having substantially identical feature sizes and are operable to maintain a difference between said first and second input signals, while maintaining a common mode output voltage at a predetermined level.

6. The method according to claim 5, wherein said MOS devices comprise thick-oxide MOS transistors.

7. The method according to claim 6, wherein said impedance divider network comprises four n-channel MOS devices, wherein two of said MOS devices receive one of said first and second input signals and two of said MOS devices receive said reference signal.

8. The method according to claim 7, wherein the outputs of said MOS devices are communicated to said latch module by said first and second pass gates.

* * * * *